US 6,734,704 B1
United States Patent — Burkland
Date of Patent: May 11, 2004

(54) VOLTAGE LEVEL-SHIFTING CONTROL CIRCUIT FOR ELECTRONIC SWITCH

(75) Inventor: William Andrew Burkland, Ames, IA (US)

(73) Assignee: Micrel, Incorporated, San Jose, CA (US)

(*) Notice: Subject to any disclaimer, the term of this patent is extended or adjusted under 35 U.S.C. 154(b) by 354 days.

(21) Appl. No.: 10/040,540

(22) Filed: Dec. 28, 2001

(51) Int. Cl.[7] .................................. H03K 19/0175
(52) U.S. Cl. ........................ 326/63; 326/68; 326/81
(58) Field of Search .............................. 326/63, 68, 80, 326/81; 327/333

(56) References Cited

U.S. PATENT DOCUMENTS 5,896,043 A * 4/1999 Kumagai .................. 326/68
6,556,047 B2 * 4/2003 Debaty ..................... 326/68

* cited by examiner

Primary Examiner—Anh Tran
(74) Attorney, Agent, or Firm—Dorsey & Whitney LLP

(57) ABSTRACT

A control circuit receives complementary logic signals ranging from Vdd to 0 VDC, and outputs a drive signal Vhs1 ranging from magnitude Vhv to Vhv+Vdd to control a high-side switch. The control circuit includes an Ibias generator and a level shift circuit that preferably includes a passive current sink mechanism, coupleable between Vdd and ground. The level shift circuit includes a totem-pole configuration of a PMOS device, an NMOS device, and an NMOS device that mirrors Ibias current. An additional NMOS device is provided, whose source node is coupled between the PMOS and NMOS devices in the totem-pole, whose gate node is coupled to Vdd, and whose drain node serves as an interface to the load circuit. A capacitor coupled across the current source hastens Vhs1 transition time. The PMOS and NMOS devices in the totem pole turn on and off complementarily responsive to the logic signals, which dictate the state of Vhs1.

20 Claims, 4 Drawing Sheets

VOLTAGE LEVEL-SHIFTING CONTROL CIRCUIT FOR ELECTRONIC SWITCH

FIELD OF THE INVENTION

The invention relates generally to control circuits used with electronic switches, and more particularly to control circuits used with logic circuitry whose so-called high-side output signals must be level-shifted to drive an electronic switch.

BACKGROUND OF THE INVENTION

FIG. 1 depicts a prior art H-bridge circuit in which a DC voltage (Vhv) is selectively coupled via switches Sh1, Sh2, Sl1, Sl2 to a load 10. In practice, Vhv may be on the order of 100 VDC, although other magnitudes could be used. Switches Sh1 and Sh2 are referred to as high-side switches in that they control current flow between the high voltage potential Vhv and the load. These switches control the high side of an H-bridge (when used with such configuration), and their control signals, Vhs1, Vhs2 are referenced to Vs or Vhv, rather than to a common ground that is shared with logic unit 40. Switches Sl1 and Sl2 are typically referenced to system ground and are termed low-side switches.

A control unit 20 must develop high-side and low-side control signals to cause switches Sh1 and Sl1 turn on or off, while switches Sh2 and Sl2 turn off or on, e.g., switch in complementary fashion. Control unit 20 receives operating potential from a power source 30, which also powers a logic unit 40. Although not explicitly shown in FIG. 1, power source 30 also provides control unit 20 with a higher potential voltage whose magnitude is at least Vhv. It will be appreciated that it is relatively easy for control unit 20 to generate control signal Vls1 to control switch Sl1 and control signal Vls2 to control switch Sl2, as switches Sl1, Sl2 are referenced to ground. However it is a more challenging task for control unit 20 to generate control signals Vhs1 and Vhs2 to control high-side switches Sh1, Sh2, as these control signals are referenced to the floating potential Vs. Because the present invention will be directed to generating high-side control signals Vhs1 or Vhs2, these control signal paths are shown with solid lines in prior art FIG. 1, whereas the low-side control signals are shown with phantom lines.

Regardless of how the high-side and low-side control signals are generated, it will be appreciated that if the various switch pairs Sh1-Sl1, and Sh2-Sl2 can be switched correctly, current can be made to flow from power source Vhv through the load, in one direction or the other, to ground. For example, if Sh1 and Sl1 are closed (as shown in FIG. 1) current will flow from Vhv through Sh1 through the load, through Sl1, to ground. If control unit 20 causes Sh1 and Sl1 to open, and causes Sl2 and Sh2 to close, current can then flow from Vhv through Sh2 through the load through Sl2 to ground. In this fashion, DC energy from source Vhv can be effectively converted to AC current flowing through the load.

Ideally control unit 20 should provide the required high-side voltage level-shifted control signals Vhs1, Vhs2 to the high-side switches Sh1, Sh2 without dissipating high power. Preferably control signals Vhs1, Vhs2 output from control unit 20 should exhibit high noise immunity, e.g., should maintain correct logic state in the presence of transient components, and should also exhibit short propagation delays through the control circuit. But as noted, it can be a challenging task to efficiently generate the high-side control signals Vhs1, Vhs2.

Some prior art level-shifting control circuits use continuous control signals and simply accept the resulting high power dissipation needed to achieve short propagation delays. This statement is especially true where the voltage level-shifting control circuit is implemented with discrete components, as opposed to being fabricated on a common integrated circuit (IC). Other prior art approaches use pulse circuits that include latches to conserve power dissipation while still providing short propagation delay. Unfortunately, however, these pulse circuits may be susceptible to noise resulting from transistor switching, from power supply transients, and/or from electrostatic discharge (ESD). U.S. Pat. No. 5,870,266 to Fogg (1999) entitled "Bridge Control Circuit and Method" discloses a control system that uses both continuous and/or continuous and pulsed control signals in an attempt to reduce power dissipation and maintain good noise immunity, while trying to achieve short propagation delay. However a Fogg type control system can be somewhat complex in its implementation.

Thus, there is a need for a control unit for an electronic switch that provides high-side level-shifted control signals Vhs1, Vhs2. while achieving short propagation delay, low power dissipation, and high noise immunity. Preferably such a control unit should generate these control signals without the complexity of using both pulsed and continuous control signals.

The present invention provides such a control unit.

SUMMARY OF THE INVENTION

The present invention provides a control unit for an electronic switch that provides level-shifted high-side control signals Vhs1, with short propagation delay, with low power dissipation and improved noise immunity, without using pulsed and continuous control signals. Advantageously, propagation delay improvement is obtained from passive current sinking capacitors.

The control circuit is coupled to power sources Vhv, Vdd, and to ground, and receives a logic input signal Vin (or complementary DC logic drive signals S2, and $\overline{S2}$) and outputs a high-side control signal Vhs1 (or Vhs2) that can be used to control a high-side electronic switch, e.g., an NMOS transistor Sh1 (or Sh2) in an electronic switch configuration. In one aspect, the control circuit includes a logic circuit, an current mirror Ibias generator, a level shift circuit that preferably includes a passive current sink mechanism comprising capacitors, and a load circuit from which Vhs1 (or Vhs2) is obtained. Alternatively, the present invention can function to output a high-side control signal to certain switch configurations, using the Ibias generator and a portion of the level shift circuit.

The complementary DC signals are used by the level shift circuit to determine the desired output logic state for Vhs1. The Ibias generator establishes and provides a holding current to maintain correct logic states after the initial transition between states, even in the presence of noise.

Within the level shift circuit, a totem-pole arrangement of solid state devices is coupled between Vdd and ground. The arrangement comprises a PMOS device, an NMOS device, and a second NMOS device that is configured as a current source that mirrors (directly or proportionally) the Ibias current. The source node of a third NMOS device is coupled between the PMOS and NMOS devices in the totem-pole, the gate node is coupled to Vdd, and the drain node serves as an interface to a load circuit coupleable to Vhv+Vdd. A capacitor is coupled across the second NMOS device current source. When S2 transitions from logical "0" to "1" is in a first DC state, current flows from the drain of the interface NMOS device. A high-side switch in an electronic switch configuration can thus be triggered with control signals that vary in amplitude from Vhv+Vdd to Vdd.

Other features and advantages of the invention will appear from the following description in which the preferred embodiments have been set forth in detail, in conjunction with the accompanying drawings.

DETAILED DESCRIPTION OF THE PREFERRED EMBODIMENTS

Figure 1:
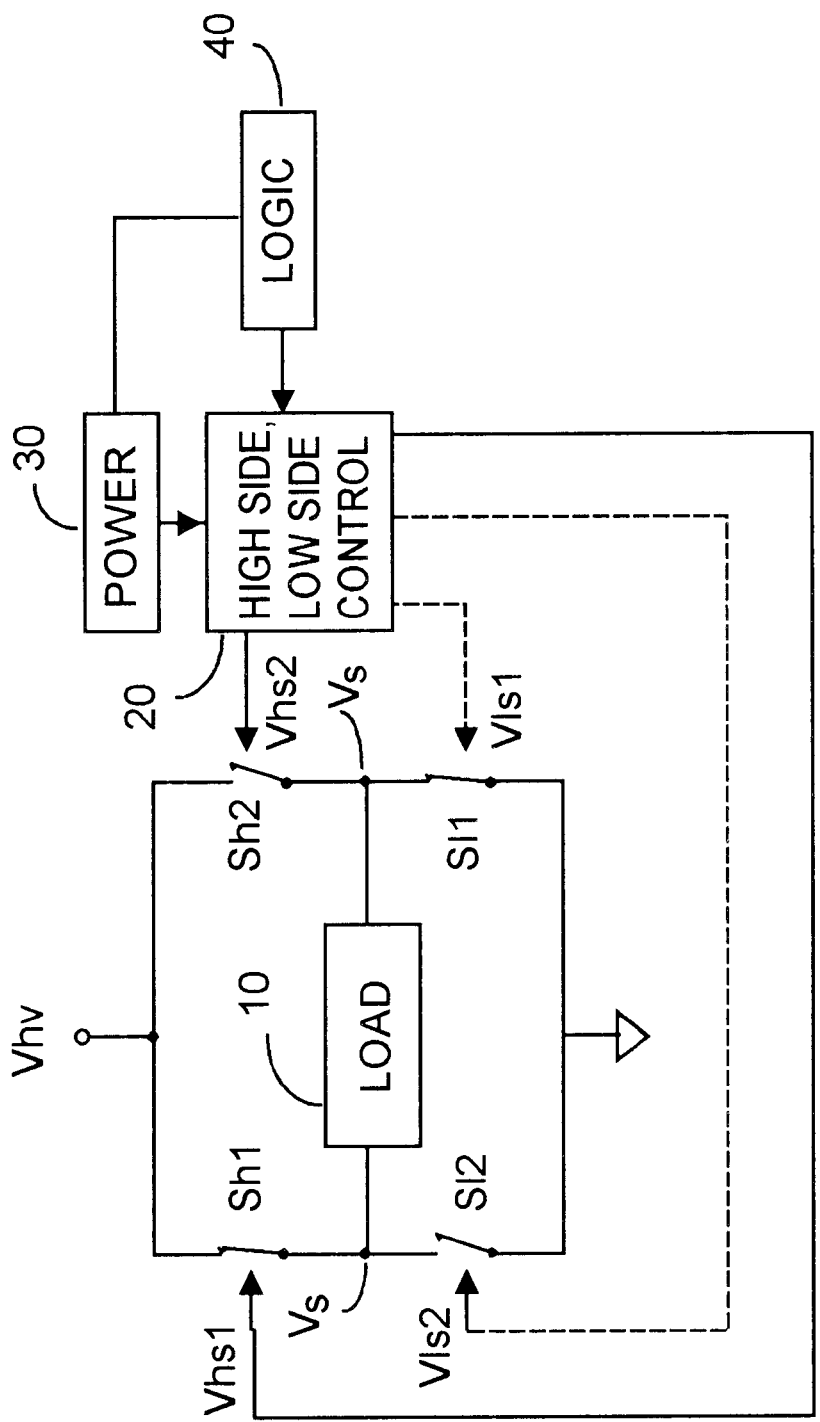
FIG. 1 is a schematic block diagram showing a control unit and a logic unit, used to control low-side and high-side switches in an electronic switch configuration, according to the prior art.
Figure 2:
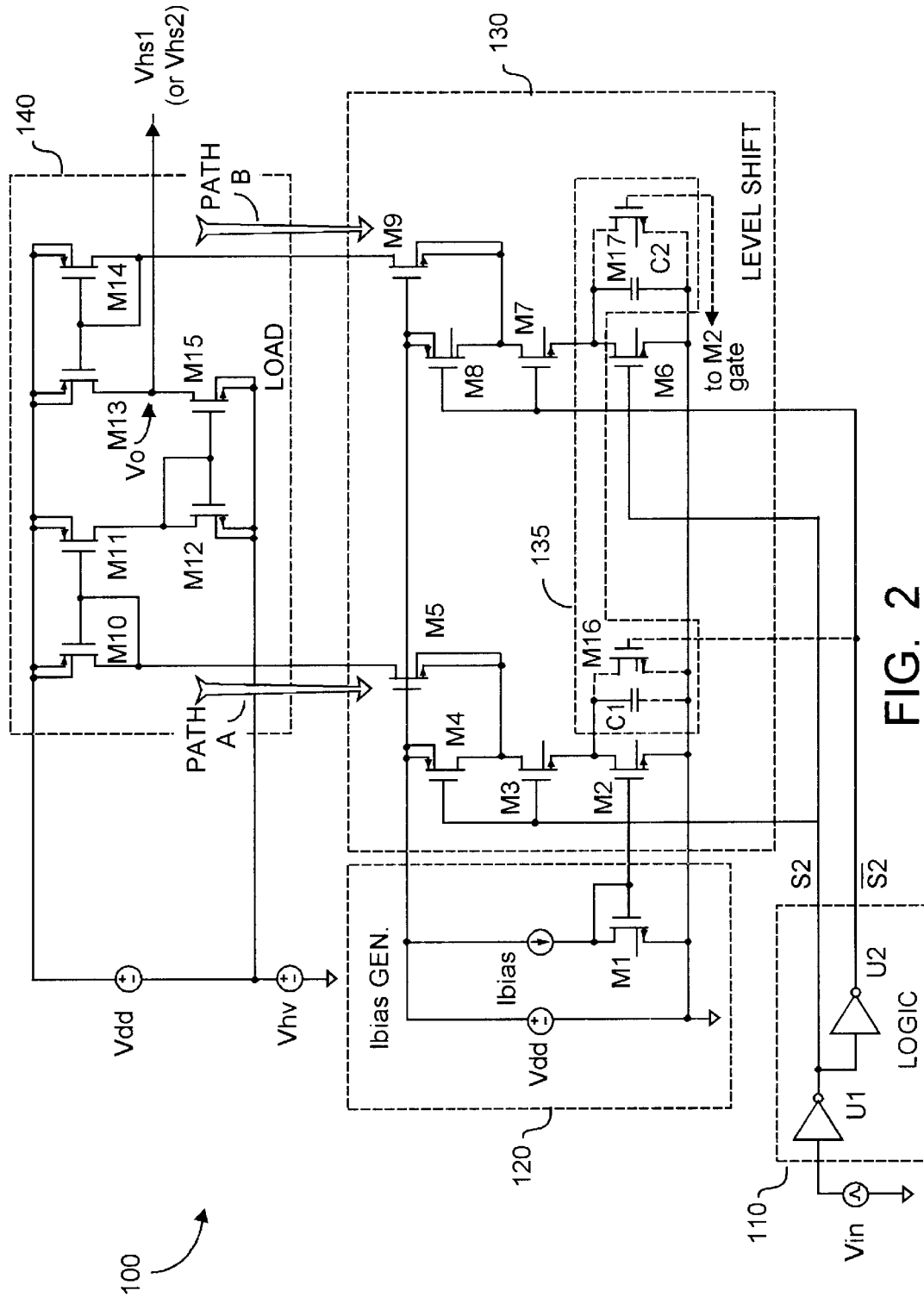
FIG. 2 is an embodiment of a control unit for use in controlling high-side switches in an electronic switch configuration, according to the present invention.

Referring to FIG. 2, a control circuit 100 according to the present invention is coupled to power sources Vhv, Vdd, and to ground, and receives as logic input signal Vin. Control circuit 100 generates a high-side control signal Vhs1 (or Vhs2) from node Vo, which signal can be used to control a high-side electronic switch, e.g., an NMOS transistor Sh1 (or Sh2), in an electronic switch configuration that need not be an H-bridge was shown in FIG. 1. Vhv may be about 100 VDC, Vdd may be about 10 VDC, although these values are exemplary and other values may be used.

In brief, depending upon the "0" or "1" DC state of the logic input signal Vin, circuit 100 is configured to define a first current path, path A, or a second current path, path B. In the configuration shown, when path A is continuous, the output signal from node Vo is "0" (e.g., Vhs1=0), and when path B is continuous, the Vo node output signal is "1" (e.g., Vhs1=1). As used herein, the notation OFF-to-ON will refer to a 0-to-1 voltage transition at node Vo, while ON-to-OFF will refer to a 1-to-0 Vo node voltage transition: As described later herein, passive current sinking capacitors (C1, C2) within control circuit 100 advantageously shorten transition times between ON-to-OFF and OFF-to-ON without substantially increasing power dissipation.

More specifically, control circuit 100 includes a logic circuit 110, an Ibias generator 120, a level shift circuit 130 that includes a preferably passive current sink 135, and a load circuit 140 whose node Vo provides the high-side control signal Vhs1 (or Vhs2). Level shift circuit 135 preferably comprises a pair of capacitors (C1, C2) that act as current sinks when as associated transistor (M3 or M7) is turned-ON, to shorten output signal state transition time.

Figure 3A:
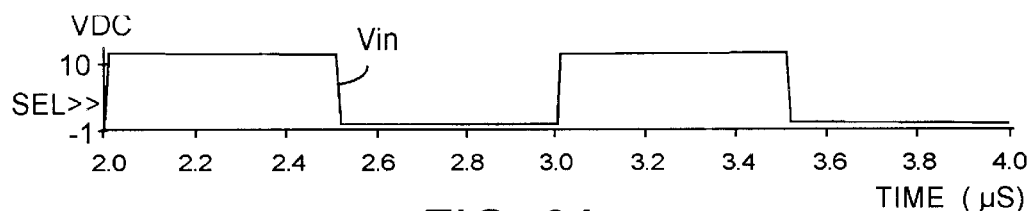
FIG. 3A is a computer simulation showing a Vin voltage waveform input to the logic circuit in the embodiment of FIG. 2, according to the present invention.
Figure 3B:
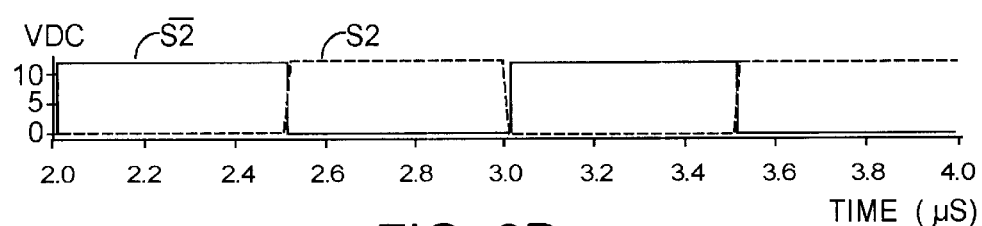
FIG. 3B is a computer simulation showing complimentary logic circuit drive signals output from the logic circuit in the embodiment of FIG. 2, according to the present invention.

Logic circuit 110 receives a logic input signal Vin and outputs complementary DC signals S2 and $\overline{S2}$ for use by the level shift circuit 130. The relative logical state of Vin (and thus of S2, and $\overline{S2}$) determines whether the signal at node Vo is "1" or "0". Logic circuit 110 may be as straightforward as a single inverter or, as shown, an inverter pair U1 and U2. In the configuration shown, logic output signal S2 will be the complement of the Vin input control signal, while $\overline{S2}$ will be a replication of Vin. In the present invention, S2 and $\overline{S2}$ are each complementary continuous or DC signals that are logical level "1" and "0" or "0" and "1". FIGS. 3A and 3B depict exemplary voltage waveforms as a function of time for Vin, S2, and $\overline{S2}$. Understandably, if complementary logic signals S2, and $\overline{S2}$ are available as input signals, then control circuit 100 may omit logic circuit 100. It is noted that FIGS. 3A–3F are computer simulations in which magnitude of C1 and C2 were increased substantially over their nominal 0.5 pF value and in which timing sequences were slowed, to better show operation of circuit 135.)

Ibias generator 120 is preferably configured as a current mirror and includes device M1, here coupled between Vdd and ground. Ibias generator 120 is coupled to device M2 within the level shift circuit 130, and can induce a mirrored current flow in M2 proportional to Ibias, and in devices coupled in series with M2. Within the level shift circuit, devices M2, M3, M4 and M5 may be used to define a portion of a first current path denoted path A, and devices M6, M7, M8 and M9 may be used to define a portion of a second current path denoted path B. When completed, path A and path B will each include a device in load circuit 140, and a completed current path A or path B will conductor current from Vdd+Vhv to ground. An exemplary value for Ibias is about 50 nA, although other magnitudes could instead be used.

In one aspect, the present invention may be defined as including Ibias generator 120 and level shift circuit 130, assuming that complementary logic signals S2 and $\overline{S2}$ are available, and that a suitable load circuit 140 is available. In a second aspect, the present invention may be defined as including Ibias generator 120 and M2, M3, M4, M5 and C1, assuming an appropriate load circuit and switch configuration are available. However the present invention will be described with reference to what is shown in FIG. 2.

Figure 3C:
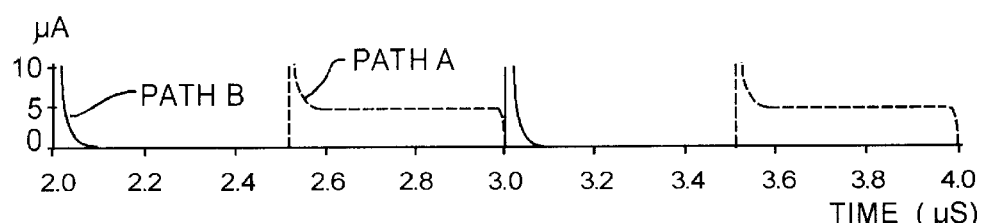
FIGS. 3C and 3D are computer simulations depicting, with different resolution, path A and path B current flow, for the embodiment of FIG. 2, according to the present invention.
Figure 3D:
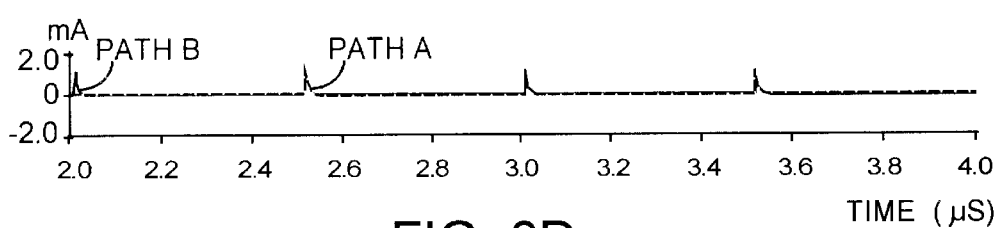
Figure 3E:
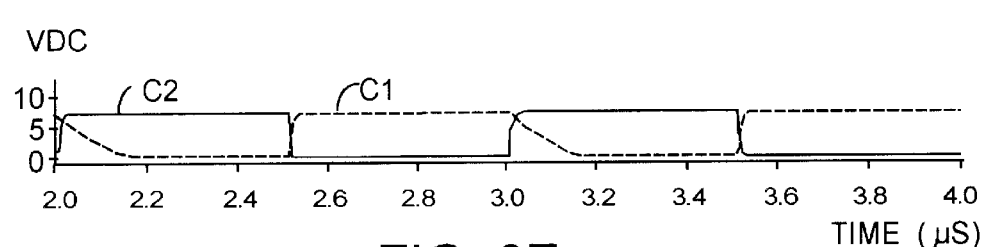
FIG. 3E is a computer simulation depicting voltage across capacitors C1 and C2 for the embodiment of FIG. 2, according to the present invention.

Referring to FIG. 2, level shift circuit 130 advantageously includes a preferably passive current sink mechanism 135, capacitors C1 and C2, each about 0.5 pF or so. C1 sinks additional current from M3 when M3 turns-ON to make path A continuous, and C2 sinks additional current from M7 when M7 turns-ON to make path B continuous. The additional current sunk by C1 or by C2 when the voltage at node Vo changes state reduces propagation delay, while reducing power consumption of circuit 100 between transitions. It will be appreciated that once C1 or C2 is charges, power dissipation through the charged capacitor is essentially nil, which promotes efficiency of the overall circuit. Note that device M6 discharges capacitor C2 in preparation for the next OFF-to-ON transition, and that current source M2 will discharge C1 in preparation for the next ON-to-OFF transition. FIGS. 3C and 3D depict path A and path B current flow (with amplified current resolution in FIG. 3C), and FIG. 3E depicts voltage waveforms across capacitors C1 and C2.

Again it is noted that the waveforms shown are for a computer simulation in which substantially larger values of C1 and C2 were used, and in which time is slowed perhaps ten-fold, the better to depict operation of the invention.

Devices M5 and M9 interface between level shift unit 130 and load unit 140. Unit 140 includes devices M10, M11, M12, M15 on one-hand, and devices M13, M14 on the other hand. As shown by FIG. 2, device M10 conducts current when path A is continuous, whereas device M14 conducts current when path B is continuous. Node Vo, at the drain of device M1 3, provides the desired high-side control voltage Vhs1 (or Vhs2), which may be coupled to the gate of a high-side switch, e.g., an NMOS device. It will be appreciated that logic circuit 100 shown in FIG. 2 could be configured to augment or replace M13 with a simple resistor, if desired, to facilitate "0" to "1" node Vo pull-up transitions.

Figure 3F:
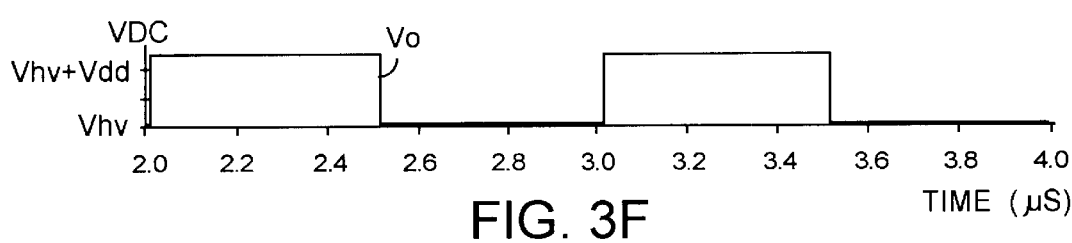
FIG. 3F is a computer simulation depicting the Vhs1 output voltage waveform at node Vo for the embodiment of FIG. 2, according to the present invention.

When path A is continuous, M11, M12, M15 mirror (directly or proportionally) current flow through path A into node Vo, from whence the Vhs1 output waveform is obtained. When path B is continuous, M13 and M14 mirror the current in path B to the output node Vo. FIG. 3F shows the voltage waveform Vhs1 (t) at node Vo as a function of time.

Consider operation of control circuit 100 during an ON-to-OFF transition, e.g., a condition in which voltage at the Vo node transitions from 1-to-0. In this state, path A becomes continuous while path B becomes discontinuous. Referring to FIGS. 3A, 3B, and 3F, at time 2.5 $\mu$S, Vin goes to "0" and S2 goes to "1". (Again it is noted that time units in FIGS. 3A–3F are exemplary relative to real-time operation of control circuit 100, and faster or slower times could in fact be used.) When S2 is "1", M3 will turn-on, and M4 will turn-off. At the same time, $\overline{S2}$ will turn-on M8 and will turn-off M7, thus breaking continuity for path B within level shift circuit 130. Although path B continuity is broken, within level shift circuit 130, at least a portion of path A continuity is established. As M3 tries to conduct source current, capacitor C1 advantageously acts as a current sink, permitting a larger initial surge of path A current, than would otherwise be possible. FIGS. 3C and 3D depict the spike of path A current, resulting from the i=C1 (dV/dt) action of capacitor C1. As depicted in phantom in FIG. 2, if desired, an optional active dedicated device M16 could be coupled across C1 to promote more active discharge of C1 before the next ON-to-OFF transition.

Consider now the various devices within load circuit 140 during this ON-to-OFF transition. As shown in FIG. 2, M5 is coupled to M10, and M9 is coupled to M14. Within level shift circuit 130, mirrored current flows (directly or proportionally) through M3, M5 and thus through M10. The M10 current flow is mirrored (directly or proportionally) within M11 and M12, and thus through the drain of M15. The result is that the drain of M13, which is to say node Vo, is pulled low, e.g., Vhs1=0, the desired result in an ON-to-OFF transition. During initial turn-on of M3, in addition to current sunk by C1, device M2 allows a small amount of current to continue to flow through the source of M3, even after C1 is charged and essentially no longer sinks current (e.g., dV/dt=0). This action helps maintain node Vo in a low voltage state, even in the presence of noise. M6 serves to discharge capacitor C2 in preparation for the next OFF-to-ON transition. In essence, C2 can act as a current sink or path to permit current flow from the source of M7, as soon as M7 turns-on.

Consider now the configuration of FIG. 2 during an OFF-to-ON transition, e.g., node Vo goes from 0 to 1, as does Vhs1. During an OFF-to-ON transition, path A is interrupted and path B is made continuous. Continuous control signal S2 from logic unit 110 turns-on M4 and turns-off M3, which interrupts continuity of path A within level shift unit 130. Since current in M10, M11, M12, M15 mirror (directly or proportionally) path A current, the result is an interruption of current flow from the drain of M15. Simultaneously the complementary continuous control signal $\overline{S2}$ from logic unit 110 turns-on M7 and turns-off M8, which make path B via level circuit 130 continuous. Current flows (mirrored directly or proportionally) within M13, which pulls node Vo high, which brings Vhs1 to a logical 1 level. Within unit 135, capacitor C2 sinks current, which permits M7 at turn-on to conduct more current than would otherwise be the case. The i=C2(dV/dt) action results in a shorter OFF-to-ON propagation delay than would be the case if C2 were omitted from the circuit. Note that current source M2 discharges C1 in preparation for the next ON-to-OFF transition. As shown in phantom in FIG. 2, a device M17 could added as a current source coupled across C2 to enable a small amount of current to continue to flow through the source of M9, even after C2 is charged.

Figure 4:
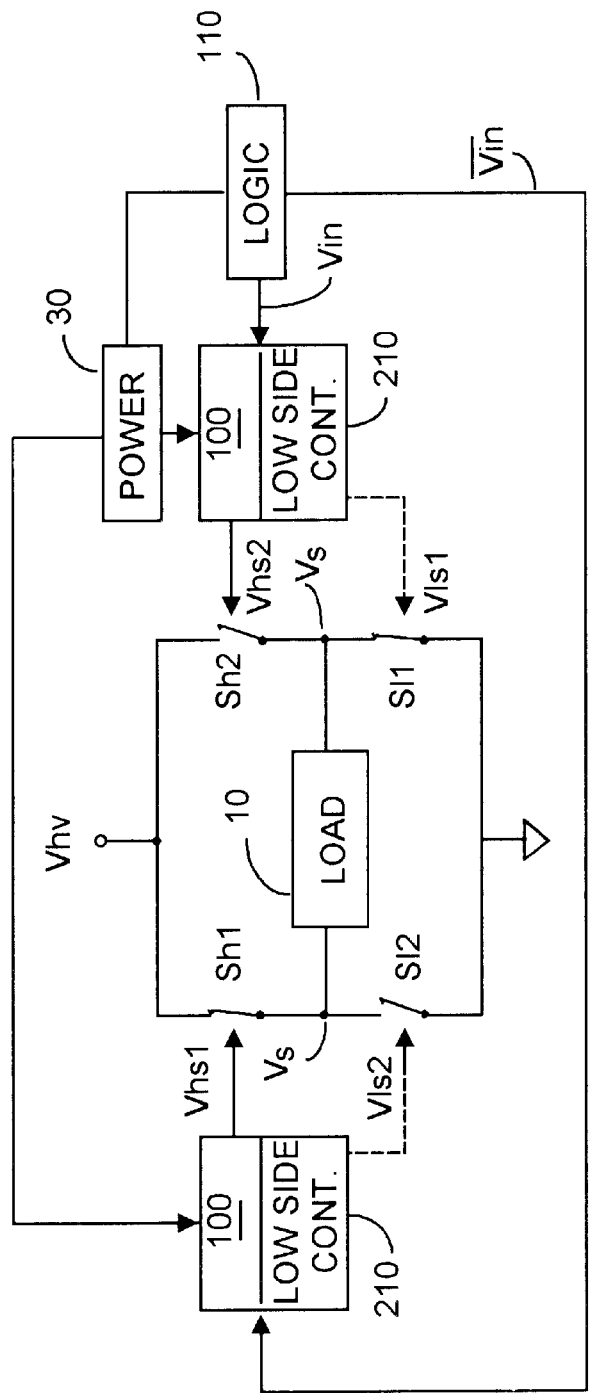
FIG. 4 depicts an exemplary system showing an electronic switch configuration whose high-side switches are controlled by two high-side control units, according to the present invention.

FIG. 4 depicts a system 200 in which two high-side control units 100, such as described with respect to FIG. 2, are used to turn ON and turn OFF high-side switches Sh1, Sh2. It is understood that the output signals Vhs1, Vhs2 from each high-side control unit 100 will be complementary in phase. A low-side controller 210 (or indeed two such controllers) provide low-side control signals Vls1, Vls2 to control low-side switches Sl1, Sl2. Details of the low-side controller(s) 210 are not given is that such circuits are well known in the art. As seen in FIG. 4, low-side switches S1, Sl2 are referenced to ground, which simplifies generating and providing the low-side control signals. While FIG. 4 depicts a single logic unit 110 shared by both high-side control units 100, and by the low side controller(s) 210, separate logic units 110 could of course be provided.

While FIG. 4 depicts use of two units of the present invention to control high-side switches Sh1, Sh2 in an H-bridge configuration, one or more units 100 may be used to control high-side switches in other configurations as well. Those skilled in the art will appreciate that, if desired, the Vhs1, Vhs2 high-side control signal could be level-shifted to a potential more negative than the S2, $\overline{S2}$ logic signals. If desired, the drain of M6 could be coupled to a dedicated current source, similar to current source M2. Indeed, a dedicated device (e.g., M16) could be coupled across C1 while a dedicated current source is coupled to the drain of M6.

Modifications and variations may be made to the disclosed embodiments without departing from the subject and spirit of the invention as defined by the following claims. For example, the high-side switch Sh1 (or Sh2) controlled by the present invention may be a NMOS device or a PMOS device, depending upon configuration of the present invention. It will be appreciated that NMOS and PMOS devices may be substituted in a suitable configuration of the present invention, and that a variety of electronic switch configurations involving Sh1, Sl1, or Sh1, Sl1, Sh2, Sl2, etc. may be accommodated.

What is claimed is:

1. A control circuit coupleable to power sources Vhv, Vdd, to ground, and coupleable to receive a logic drive signal referenced to ground, the control circuit outputting a signal useable to control a high-side switch operable between Vhv+Vdd and ground, the control circuit including:

a current generator to establish a mirrorable reference current flow, Ibias;

a level shift circuit, coupleable between Vdd and ground, and coupled to said Ibias generator, including:
  a first plurality of solid state devices including in series-coupled configuration a first solid state device, a second solid state device, and a third solid state device that is coupled as a current source mirroring said Ibias, said first solid state device and said second solid state device changing states complementarily responsive to a state of said logic drive signal;
  a fourth solid state device having a gate node coupled to said Vdd, a source node coupled between said first solid state device and said second solid state device, and having a drain node interfaceable to a load circuit coupleable to Vhv+Vdd;
  a first capacitor coupled across said third solid state device;
  wherein when said logic drive signal is in a first state, said first solid state device turns-off, said second solid state device turns-on, and said first capacitor sinks at least transient current from second solid state device, and said drain node of said fourth device conducts current useable to drive a load circuit having an output node from which a signal coupleable to said high-side switch is present.

2. The control circuit of claim 1, wherein said first solid state device is a PMOS device, and said second solid state device, said third solid state device, and said fourth solid state device is an NMOS device.

3. The control circuit of claim 1, wherein said first solid state device and said second solid state device each have a gate node coupled to receive said logic drive signal.

4. The control circuit of claim 1, further including a fifth solid state device coupled across said first capacitor so as to discharge said first capacitor upon receipt of a signal complementary to said logic drive signal.

5. The control circuit of claim 1, wherein said third solid state device mirrors current proportionally to said Ibias current.

6. The control circuit of claim 1, further including a load circuit, coupleable between Vhv and Vhv+Vdd, so as to conduct, when said logic drive signal is in said first state, current proportional to said Ibias current from said output node to provide a Vhs1 control signal coupleable to said high-side switch.

7. The control circuit of claim 6, wherein said load circuit includes:
  means for mirroring current proportional to said Ibias; and
  means for selectively enabling said output node of said load circuit to conduct a current proportional to said Ibias.

8. The control circuit of claim 1, further including:
  a second plurality of solid state devices including in series-coupled configuration a sixth solid state device, a seventh solid state device, and an eighth solid state device, said sixth solid state device and said seventh solid state device coupled to change states complementarily upon receipt of a complementary version of said logic drive signal, and said eighth solid state device coupled to receive said logic drive signal;
  a ninth solid state device having a gate node coupled to said Vdd, having a source node coupled to a junction of said sixth solid state device and said seventh solid state device, and have a drain node; and
  a second capacitor coupled across said eighth solid state device;
  wherein when said seventh solid state device is turned-on, said second capacitor sinks at least transient current from said seventh solid state device, and said drain node of said ninth solid state device conducts current useable to drive a load circuit having an output node from which a signal coupleable to said high-side switch is present.

9. The control circuit of claim 1, further including a logic circuit coupled to receive said logic drive signal, and to output, for use by said level shift circuit, a replica and a complementary version of said logic drive signal.

10. The control circuit of claim 9, wherein in a "0" state said replica is about 0 VDC and in a "1" state said replica is about Vdd VDC.

11. The control circuit of claim 1, wherein Vhv is about 100 VDC.

12. The control circuit of claim 1, wherein at least one of said first capacitor and said second capacitor has a magnitude less than about 1 pF.

13. A control circuit that is coupleable to power sources Vhv, Vdd, and to ground, and coupleable to complementary logic drive signals whose "1" state is about Vdd, and that outputs a high-side drive signal Vhs1, switchable between Vhv and Vhv+Vdd, useable to control a high-side switch, the control circuit including:
  a current generator that establishes a mirrored reference current flow, Ibias;
  a level shift circuit, coupled to said Ibias generator, and including a first plurality and a second plurality of series-coupled solid state switches coupleable between Vdd and ground, and further including a passive current sink circuit coupled to a ground-referenced switch in plurality; and
  a load circuit coupled between Vdd and Vhv, and including a first interface solid state switch coupled to a Vdd-referenced switch in said first plurality to define a first current path from Vdd to ground, and including a second interface solid state switch coupled to said second plurality to define a second current path from Vdd to ground, wherein a state of said complementary logic drive signals determines whether said first or said second current path is continuous at a given time;
  wherein said load circuit is coupleable to said current generator to provide current to one of said first and second current paths, such that a node providing said drive signal Vhs1 mirrors current in one of said current paths;
  wherein during a transition state of said complementary logic drive signals, said passive current sink sinks current from an associated switch in one of said first plurality and said second plurality of solid state devices to reduce transition time.

14. The control circuit of claim 13, wherein said passive current sink includes a capacitor coupled across a solid state switch in each of said first and second plurality of solid state devices.

15. The control circuit of claim 13, wherein each said capacitor is less than about 1 pF in magnitude.

16. The control circuit of claim 13, when Vhv is less than about 100 VDC.

17. A method of providing a high-side control signal that in a "1" state is magnitude Vhv+Vdd and in a "0", state is magnitude Vhv for use by a high-side switch that is operable between Vhv+Vdd and ground, the method comprising the following steps:

(a) establishing a mirrorable reference current flow, Ibias;

(b) providing complementary first and second current paths that can conduct current from Vhv+Vdd to ground, the first of said current paths conducting current when a logic control signal is in a first state, and the second of said current paths conducting current when said logic control signal is in a complementary state;

(c) rapidly sinking at least a transient current when said first current path begins to conduct current to ground; and (d) providing an output node referenced to Vhv+Vdd from which a current proportional to said Ibias flows when said logic control signal is in said first state;

wherein a voltage signal at said output node transitions between Vhv+Vdd and Vdd responsive to said first state of said logic control signal.

18. The method of claim 17, wherein step (c) is carried out passively.

19. The method of claim 17, wherein step (c) includes coupling at least one capacitor in parallel to a ground-referenced portion of the first current path.

20. The method of claim 17, wherein at least one of the first and the second current path is defined by series-coupled solid state devices.

\* \* \* \* \*